(12) United States Patent
Inoue et al.

(10) Patent No.: US 9,087,781 B2
(45) Date of Patent: Jul. 21, 2015

(54) SEMICONDUCTOR DEVICE AND METHOD OF MANUFACTURING THE SAME

(71) Applicant: Shinko Electric Industries Co., Ltd., Nagano-shi, Nagano (JP)

(72) Inventors: Akinobu Inoue, Nagano (JP); Haruo Sorimachi, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 173 days.

(21) Appl. No.: 13/892,483

(22) Filed: May 13, 2013

(65) Prior Publication Data

US 2013/0307163 A1    Nov. 21, 2013

(30) Foreign Application Priority Data

May 17, 2012   (JP) ................. 2012-112990

(51) Int. Cl.
*H01L 23/28* (2006.01)
*H01L 21/56* (2006.01)
*H01L 23/16* (2006.01)
*H01L 23/31* (2006.01)

(52) U.S. Cl.
CPC .............. *H01L 23/28* (2013.01); *H01L 21/56* (2013.01); *H01L 21/563* (2013.01); *H01L 23/16* (2013.01); *H01L 23/3128* (2013.01); *H01L 2224/16225* (2013.01); *H01L 2224/32225* (2013.01); *H01L 2224/73204* (2013.01); *H01L 2224/83192* (2013.01); *H01L 2924/15311* (2013.01); *H01L 2924/18161* (2013.01); *H01L 2924/3511* (2013.01)

(58) Field of Classification Search
USPC ................... 257/777, 796, 738, 778; 438/127
See application file for complete search history.

(56) References Cited

U.S. PATENT DOCUMENTS

| 5,672,548 | A  | * | 9/1997  | Culnane et al. ............... 438/118 |
| 6,410,988 | B1 | * | 6/2002  | Caletka et al. ................ 257/778 |
| 7,495,346 | B2 | * | 2/2009  | Nakanishi et al. ............ 257/796 |
| 7,728,440 | B2 | * | 6/2010  | Honda .......................... 257/778 |
| 2011/0316150 | A1 | | 12/2011 | Ozawa |

FOREIGN PATENT DOCUMENTS

| JP | 2000-299431 A | 10/2000 |
| JP | 2001-135749 A1 | 5/2001 |
| JP | 2012-9655 A1 | 1/2012 |
| JP | 2012-160707 A | 8/2012 |

* cited by examiner

*Primary Examiner* — Roy Potter
(74) *Attorney, Agent, or Firm* — Kratz, Quintos & Hanson, LLP

(57) ABSTRACT

A semiconductor device includes a wiring substrate, a semiconductor chip whose connection terminal is connected to the wiring substrate, an underfill resin formed from a clearance between the wiring substrate and the semiconductor chip to a periphery area of the semiconductor chip, wherein the underfill resin in the periphery area is formed at a same height as an upper surface of the semiconductor chip, an auxiliary member fixed on the semiconductor chip by an adhesive layer, and including a protruding portion which protrudes to an outside from the semiconductor chip, and the protruding portion arranged at least on the underfill resin via the adhesive layer, and a sealing resin sealing the underfill resin and at least side faces of the auxiliary member, wherein respective coefficients of thermal expansion of the auxiliary member and the adhesive layer are larger than a coefficient of thermal expansion of the semiconductor chip.

7 Claims, 11 Drawing Sheets when cooling to 25°C when mounting to the motherboard (240°C)

when transfer molding (170~180°C)

when cooling to 25°C when mounting to the motherboard (240°C)

US 9,087,781 B2

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2012-112990, filed on May 17, 2012, the entire contents of which are incorporated herein by reference.

FIELD

This invention is related to a semiconductor device and a method of manufacturing the same.

BACKGROUND

In the prior art, there are semiconductor devices used in various electronic devices. In an example of such semiconductor devices, the device has such a structure that a semiconductor chip is flip-chip connected onto a wiring substrate.

In recent years, in order to respond to the demands for the higher performance, and the miniaturization, etc., of the electronic device, the stacked type semiconductor device in which the semiconductor packages are stacked three-dimensionally has already been put to practical utilization.

A related art is disclosed in Japanese Laid-open Patent Publication No. 2001-135749.

As explained in the column of the preliminary matter described later, when a thinner body in the wiring substrate of the semiconductor device is advanced, such a situation is brought about that an amount of the warp of the wiring substrate caused at the time of heating process exceeds an allowable value. Therefore, when the semiconductor device is mounted on the motherboard, sufficient reliability of the electrical connection cannot be achieved by the influence of the warp of the wiring substrate.

SUMMARY

According to one aspect discussed herein, there is provided a semiconductor device, which includes a wiring substrate, a semiconductor chip whose connection terminal is connected to the wiring substrate, an underfill resin formed from a clearance between the wiring substrate and the semiconductor chip to a periphery area of the semiconductor chip, wherein the underfill resin in the periphery area is formed at a same height as an upper surface of the semiconductor chip, an auxiliary member fixed on the semiconductor chip by an adhesive layer, and including a protruding portion which protrudes to an outside from the semiconductor chip, and the protruding portion arranged at least on the underfill resin via the adhesive layer, and a sealing resin sealing the underfill resin and at least side faces of the auxiliary member, wherein respective coefficients of thermal expansion of the auxiliary member and the adhesive layer are larger than a coefficient of thermal expansion of the semiconductor chip.

Also, according to another aspect discussed herein, there is provided a method of manufacturing a semiconductor device, which includes forming resin material on a wiring substrate, pushing a connection terminal of a semiconductor chip into the resin material, and connecting the connection terminal to a connection pad of the wiring substrate, and forming an underfill resin from the resin material from a clearance between the wiring substrate and the semiconductor chip to a periphery area of the semiconductor chip, wherein the underfill resin in the periphery area is formed at a same height as an upper surface of the semiconductor chip, forming an auxiliary member including a protruding portion which protrudes to an outside from the semiconductor chip, on the semiconductor chip via an adhesive layer, wherein the protruding portion is arranged on the underfill resin via the adhesive layer, and forming a sealing resin sealing the underfill resin and at least side faces of the auxiliary member, wherein respective coefficients of thermal expansion of the auxiliary member and the adhesive layer are larger than a coefficient of thermal expansion of the semiconductor chip.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

An embodiment will be explained with reference to the accompanying drawings hereinafter.

Figure 1A:
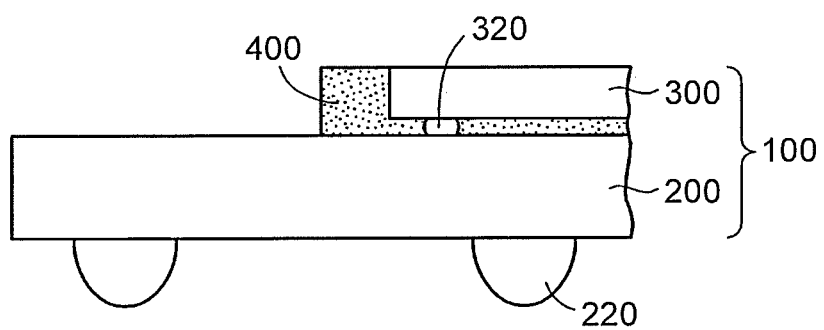
FIGS. 1A and 1B are sectional views (#1) depicting a semiconductor device according to the preliminary matter.

Prior to the explanation of an embodiment, the preliminary matter to be set forth as a basis will be explained hereunder. As depicted in FIG. 1A, a semiconductor device 100 according to the preliminary matter includes a wiring substrate 200 and a semiconductor chip 300 mounted thereon. Connection terminals 320 of the semiconductor chip 300 are flip-chip connected to connection pads (not shown) of the wiring substrate 200.

Also, an underfill resin 400 is formed from a clearance located under the semiconductor chip 300 to a periphery area of the semiconductor chip 300. Also, external connection terminals 220 are provided on the lower surface side of the wiring substrate 200.

In such semiconductor device 100, in order to respond to further demands of the miniaturization and the thinner body, the trials to thin a thickness of the wiring substrate 200 are performed.

Figure 1B:
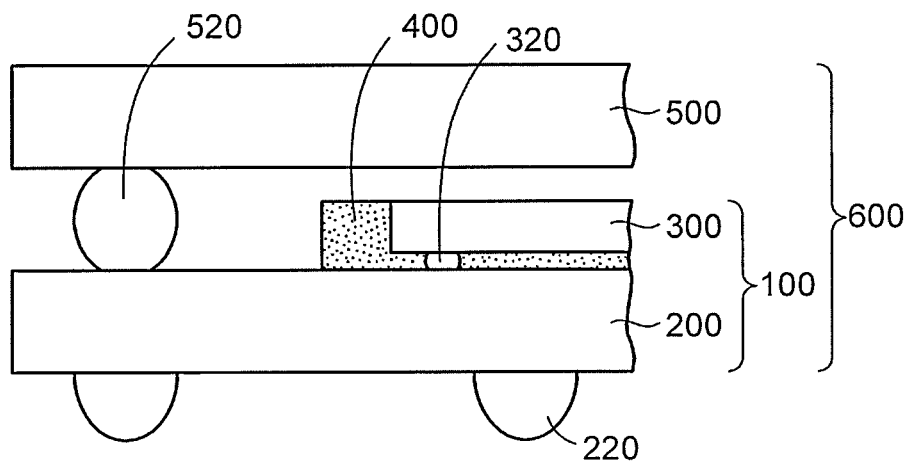

As depicted in FIG. 1B, an upper semiconductor device 500 is stacked on the semiconductor device 100 via bump electrodes 520, whereby a stacked type semiconductor device 600 having a PoP (Package on Package) structure is also manufactured in some cases. In this case, there is also the demand for thinning a total thickness of the stacked type semiconductor device 600, and thus the thinner body of the wiring substrate 200 is demanded.

However, when a thickness of the wiring substrate 200 is thinned to 300 µm or less, for example, such a problem is caused that an amount of the warp is increased in the range from a normal temperature (25° C.) to a heating temperature (reflow temperature, e.g., 240° C.). The step of performing the heating process is the step of connecting the semiconductor chip 300 to the wiring substrate 200, and the step of connecting the semiconductor device 100 to the motherboard, or the like.

Further, a narrower pitch of the external connection terminal 220 of the semiconductor device 100 is advanced. By this matter, an allowable amount of the warp of the semiconductor device 100 also becomes smaller.

Like the above, when the wiring substrate 200 of the semiconductor device 100 is made to the thinner body, such a problem is caused that an amount of the warp exceeds the allowable value and thus the semiconductor device 100 cannot be mounted on the motherboard with good reliability.

Figure 2:
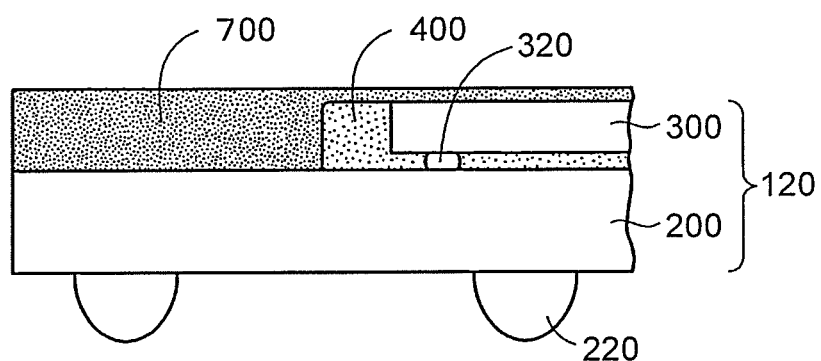
FIG. 2 is a sectional view (#2) depicting the semiconductor device according to the preliminary matter.

As the countermeasure against the problem, like a semiconductor device 120 depicted in FIG. 2, there is the method in which the wiring substrate 200 and the semiconductor chip 300 are sealed with a sealing resin 700, whereby the rigidity of the wiring substrate 200 is reinforced, and also the warp of the wiring substrate is reduced.

However, when the thinner body of the wiring substrate 200 and a narrower pitch of the external connection terminal 220 are further advanced, the allowable value of the amount of the warp which is requested at the time when the wiring substrate 200 is mounted on the motherboard, is also set to small value. As a result, there is a limit in the compatibility between the thinner body of the wiring substrate 200 and the suppression of the amount of the warp.

The semiconductor device and the method of manufacturing the same according to the embodiment, which will be explained hereunder, can solve the above-mentioned problems.

Embodiment

FIG. 3A to FIG. 5 are views depicting a semiconductor device according to an embodiment. As depicted in a sectional view in FIG. 3A, a wiring substrate 10 of a semiconductor device 1 of the embodiment is a coreless substrate having no core substrate, and includes a first insulating layer 12 and a second insulating layer 14 which is laminated thereon, as an insulating base material.

The first insulating layer 12 and the second insulating layer 14 are formed of an epoxy resin, a polyimide resin, or the like, for example. A thickness of the wiring substrate 10 is 150 µm to 300 µm for example, and the wiring substrate 10 is made to the thinner body.

First wiring layers 20 are formed on the lower surface of the first insulating layer 12. First via holes VH1 each depth of which reaches the first wiring layer 20 are formed in the first insulating layer 12. A first via conductor VC1 is filled in the first via holes VH1 of the first insulating layer 12 respectively. Also, second wiring layers 22 each connected to the first wiring layer 20 via the first via conductor VC1 are formed on an upper surface of the first insulating layer 12.

Further, second via holes VH2 each depth of which reaches the second wiring layer 22 are formed in the second insulating layer 14. A second via conductor VC2 is filled in the second via holes VH2 of the second insulating layer 14 respectively. Third wiring layers 24 each connected to the second wiring layer 22 via the second via conductor VC2 are formed on the upper surface side of the second insulating layer 14.

The first to third wiring layers 20, 22, 24 and the first and second via conductors VC1, VC2 are formed of a metal such as copper, or the like, which is applicable to the wiring.

Also, a solder resist 16 in which an opening portion 16a is provided on connection pads P of the first wiring layers 20 respectively is formed on the lower surface of the first insulating layer 12. The connection pads P of the first wiring layers 20 are formed to include a contact layer (not shown) such as a nickel/gold plating layer, or the like.

Also similarly, a solder resist 18 in which an opening portion 18a is provided on the connection pads P of the third wiring layers 24 respectively is formed on the upper surface of the second insulating layer 14. Also similarly, the connection pads P of the third wiring layers 24 are formed to include a contact layer (not shown) such as a nickel/gold plating layer, or the like.

As the preferred example, the wiring substrate 10 of coreless type is depicted. But a wiring substrate, in which built-up wirings are formed on both surface sides of a core substrate formed of a glass epoxy resin, or the like may be used.

Figure 3A:
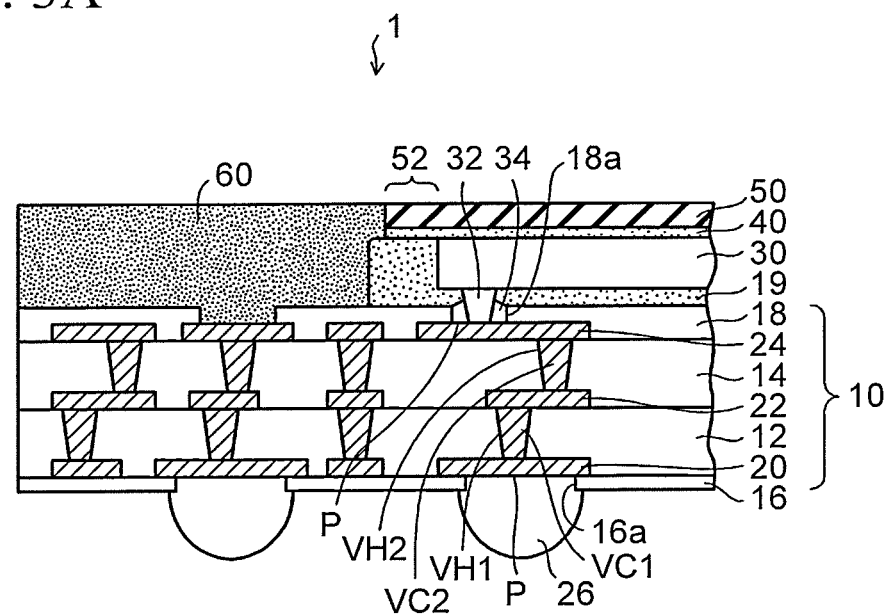
FIG. 3A is a sectional view depicting a semiconductor device according to an embodiment.

Further, connection terminals 32 of a semiconductor chip 30 are flip-chip connected to the connection pads P of the third wiring layers 24 of the wiring substrate 10. In the example of FIG. 3A, the connection terminals 32 of the semiconductor chip 30 are formed of a gold (Au) bump, and are electrically connected to the connection pads P of the wiring substrate 10 by a solder layer 34. A thickness of the semiconductor chip 30 is 50 µm to 200 µm, for example.

An underfill resin 19 is formed from a clearance between the semiconductor chip 30 and the wiring substrate 10 to a periphery area that surrounds the semiconductor chip 30. The underfill resin 19 located in the periphery area of the semiconductor chip 30 is formed at the same height as an upper surface of the semiconductor chip 30.

Figure 3B:
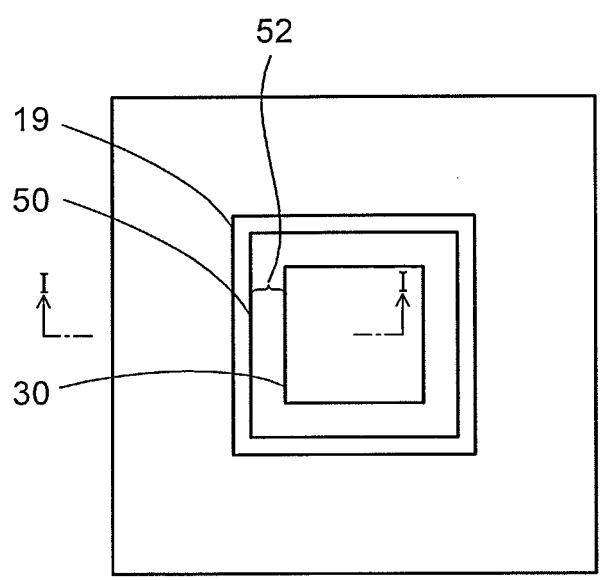
FIG. 3B is a perspective plan view depicting the semiconductor device according to the embodiment, wherein FIG. 3A corresponds to a partial enlarged sectional view taken along I-I in FIG. 3B.

FIG. 3B is a perspective plan view depicting the semiconductor device according to the embodiment, and FIG. 3A corresponds to a partial enlarged sectional view taken along I-I in FIG. 3B. By reference to FIG. 3B together, an auxiliary member 50 is formed on the semiconductor chip 30 via an adhesive layer 40. For example, a thickness of the adhesive layer 40 is 10 µm to 20 µm and a thickness of the auxiliary member 50 is about 50 µm to 100 µm.

The auxiliary member 50 has an area larger than an area of the semiconductor chip 30, and is arranged to have a protruding portion 52 which protrudes to an outside from four sides of the semiconductor chip 30. The protruding portion 52 of the auxiliary member 50 is arranged on the underfill resin 19 located in the periphery area of the semiconductor chip 30 via the adhesive layer 40. A protruded width of the protruding portion 52 from the semiconductor chip 30 is about 0.4 mm to 1 mm, for example. The auxiliary member 50 is formed of insulating material such as a resin, or the like.

In this manner, the auxiliary member 50 is fixed onto the underfill resin 19 which fixes mechanically the semiconductor chip 30.

In the case that the rigidity is provided to the auxiliary member 50, a fiber reinforcement containing resin is used. As the fiber reinforcement containing resin, a glass epoxy resin formed of a glass fiber impregnated with an epoxy resin, an aramid epoxy resin formed of an aramid fiber impregnated with an epoxy resin, a carbon epoxy resin formed of a carbon fiber impregnated with an epoxy resin, or the like can be used.

Also, the auxiliary member 50 has a coefficient of thermal expansion larger than a coefficient of thermal expansion of the semiconductor chip 30. Further, it is preferable that the auxiliary member 50 has a coefficient of thermal expansion larger than a coefficient of thermal expansion of the wiring substrate 10.

For example, the coefficient of thermal expansion of the wiring substrate 10 is 15 to 20 ppm/° C., the coefficient of thermal expansion of the semiconductor chip 30 formed of silicon wafer is 3 ppm/° C., and the coefficient of thermal expansion of the auxiliary member 50 is 25 ppm/° C.

Also, the adhesive layer 40 has a coefficient of thermal expansion larger than a coefficient of thermal expansion of the semiconductor chip 30. Moreover, it is preferable that the adhesive layer 40 has a coefficient of thermal expansion larger than a coefficient of thermal expansion of the wiring substrate 10. The coefficient of thermal expansion of the adhesive layer 40 is 25 ppm/° C., for example.

Further, as also depicted in FIG. 3A, a sealing resin 60 is formed on the wiring substrate 10 in the area of the lateral direction of the underfill resin 19 covering the side face of the semiconductor chip 30, the adhesive layer 40 and the auxiliary member 50.

By this matter, respective side faces of the underfill resin 19, the adhesive layer 40, and the auxiliary member 50 are sealed with the sealing resin 60. In this manner, the side faces of the auxiliary member 50 are fixed with the sealing resin 60.

The coefficient of thermal expansion of the auxiliary member 50 is set larger than that of the semiconductor chip 30. Whereby, the auxiliary member 50 functions as the warp correcting plate which corrects the influence of the warp due to the semiconductor chip 30. Further, the coefficient of thermal expansion of the auxiliary member 50 is set larger than that of the wiring substrate 10. Whereby, the auxiliary member 50 functions as the warp correcting plate which corrects the influence of the warp due to both of the semiconductor chip 30 and the wiring substrate 10.

In the example in FIG. 3A, an upper surface of the auxiliary member 50 and an upper surface of the sealing resin 60 are arranged at the same height to constitute the same plane. Besides this example, like a first variation depicted in FIG. 4A, the sealing resin 60 may have a ring-like projecting portion 62 on a peripheral part of the auxiliary member 50 such that the peripheral part of the auxiliary member 50 is covered with the projecting portion 62 of the sealing resin 60.

Figure 4A:
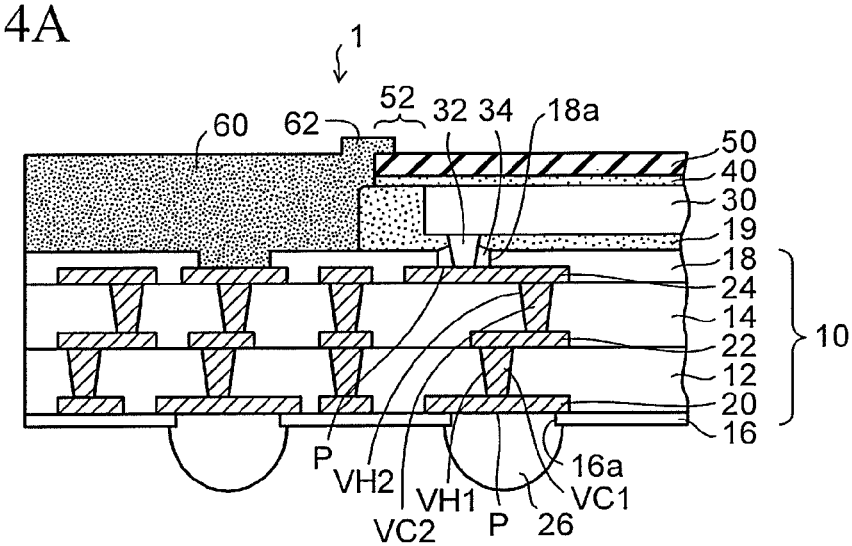
FIGS. 4A to 4C are sectional views depicting semiconductor devices according to first to third variations of the embodiment.
Figure 4B:
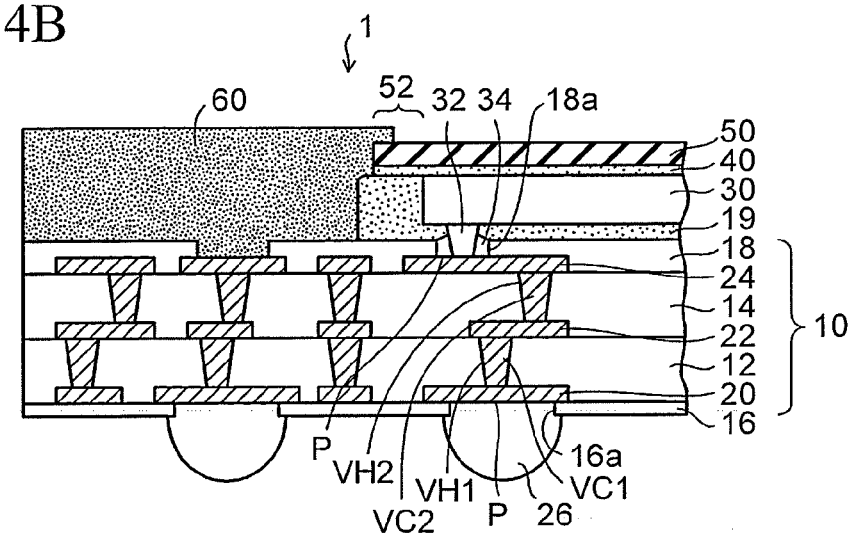

Alternatively, like a second variation depicted in FIG. 4B, a thickness of the sealing resin 60 may be made thicker over the whole in FIG. 3A such that the peripheral part of the auxiliary member 50 is covered with the sealing resin 60.

Figure 4C:
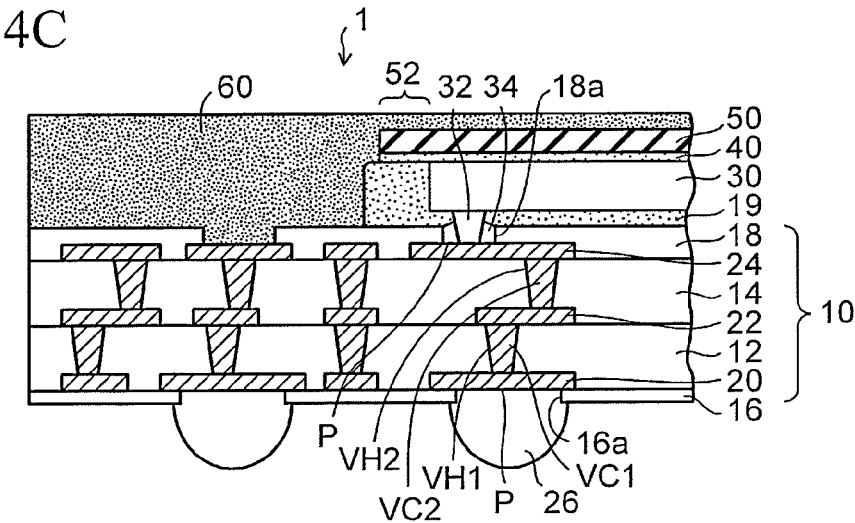

Otherwise, like a third variation depicted in FIG. 4C, the whole area of an upper surface of the wiring substrate 10 and an upper surface of the auxiliary member 50 may be covered with the sealing resin 60.

As in the first to third variations depicted in FIGS. 4A to 4C, at least the peripheral part of the auxiliary member 50 is sealed with the sealing resin 60. Whereby, even when the relatively large warp occurs, it can be prevented that the auxiliary member 50 is peeled from the underfill resin 19.

Like the above, by employing such a structure that at least the side faces of the auxiliary member 50 are sealed with the sealing resin 60, the auxiliary member 50 is enabled to function more effectively as the warp correcting plate.

The underfill resin 19, the adhesive layer 40, and the sealing resin 60, all being mentioned above, are formed of a thermosetting epoxy resin, for example.

Figure 5:
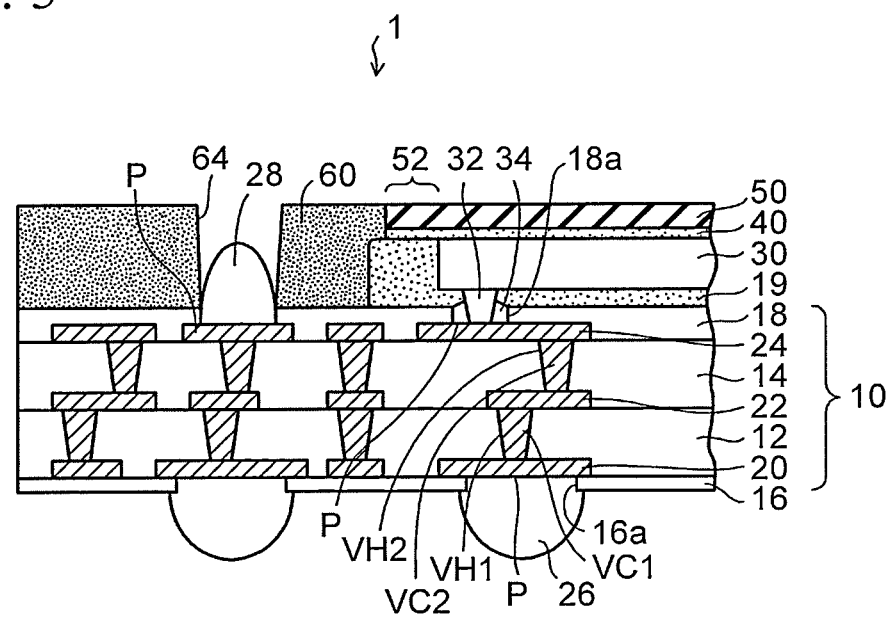
FIG. 5 is a sectional view depicting another semiconductor device according to the embodiment.

As depicted in FIG. 5, in the case that an upper semiconductor device (not shown) is stacked on the semiconductor device 1, the sealing resin 60 may be processed by the laser, or the like to form opening portions 64 each reaching the connection pad P therein, and then bump electrodes 28 may be formed in these opening portions.

By this matter, the upper semiconductor device (not shown) is stacked on the semiconductor device 1, and then the bump electrodes 28 of the semiconductor device 1 and the connection terminals of the upper semiconductor device are connected mutually. In the case of this mode, for example, a CPU chip is used as the semiconductor chip 30 of the semiconductor device 1, and a plurality of memory chips are mounted in the upper semiconductor device.

Figure 6:
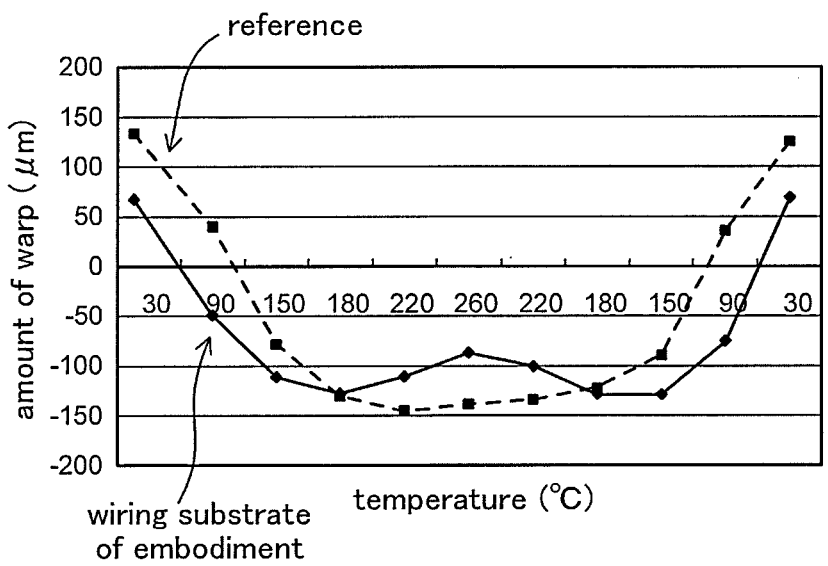
FIG. 6 is a graph depicting a temperature dependence of the warp in both the semiconductor device in the reference and the semiconductor device according to the embodiment, by the simulation.

Next, a warp correcting function of the auxiliary member 50 of the semiconductor device 1 of the present embodiment will be explained hereunder. FIG. 6 depicts the results in which the semiconductor device 120 explained in the preliminary matter in FIG. 2 is used as the reference (standard), and a temperature dependence in the amount of the warp in both the reference and the semiconductor device 1 in the embodiment in FIG. 3A, is indicated by the simulation.

A difference between the semiconductor device 120 in the reference and the semiconductor device 1 in the embodiment is whether the auxiliary member 50 exists, or does not exist, and other factors are substantially same. The coefficient of thermal expansion of the auxiliary member 50 is set larger than the coefficient of thermal expansion of the wiring substrate 10.

As depicted in FIG. 6, in the semiconductor device 120 in the reference, a convex warp occurs in the range from 25° C. to 100° C., whereas a concave warp occurs in the range from 100° C. to 260° C., and the amount of the warp is changed substantially linearly.

On the contrary, in the semiconductor device 1 of the embodiment, when a temperature is low on the boundary of 170° C. to 180° C., the warp of the semiconductor device 1 has the amount of the warp of the minus (−) side in contrast to the warp in the reference. As a result, the warp can be corrected toward the concave direction. Also, when a temperature is high on the boundary of 170° C. to 180° C., the warp of the semiconductor device 1 has the amount of the warp of the plus (+) side in contrast to the warping in the reference. As a result, the warp can be corrected toward the convex direction.

Figure 7:
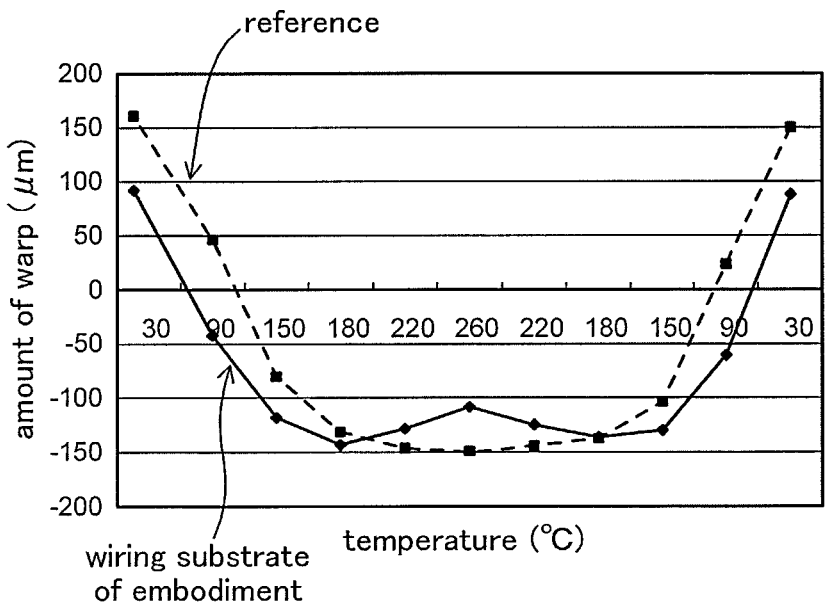
FIG. 7 is a graph depicting a temperature dependence of the warp in both the semiconductor device in the reference and the semiconductor device according to the embodiment, by the actual measurement.

FIG. 7 depicts the actual measurement values of the amount of the warp in both the semiconductor device 120 in the reference and the semiconductor device 1 in the embodiment, and the similar tendency to the simulation result is obtained.

Figure 8A:
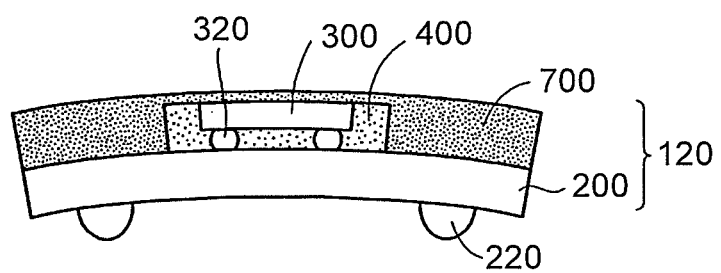
FIGS. 8A and 8B are sectional views depicting schematically respective states in which the warp occurs in the semiconductor devices in the case that no auxiliary member exists.

For further explanation, when the semiconductor chip 300 is mounted on the wiring substrate 200 and the underfill resin 400 is formed, the convex warp occurs in the semiconductor device 120. As depicted in FIG. 8A, when the sealing resin 700 is formed in the semiconductor device 120, the warp can be decreased.

Figure 8B:
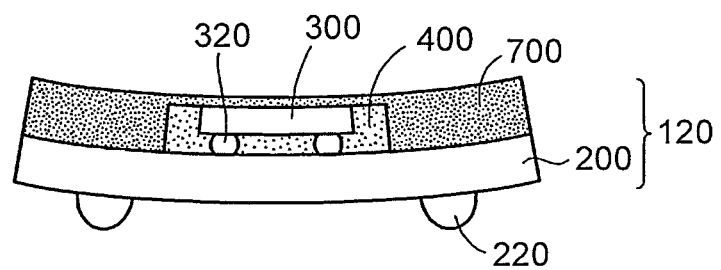

However, as depicted in FIG. 8B, in the case that the semiconductor device 120 is mounted on the motherboard, this semiconductor device 120 is heated up to 240° C. as a melting temperature of the solder, and thus the warp which exceeds the allowable value is caused. As a result, the reliability of the electrical connection to the motherboard cannot be obtained.

Figure 9A:
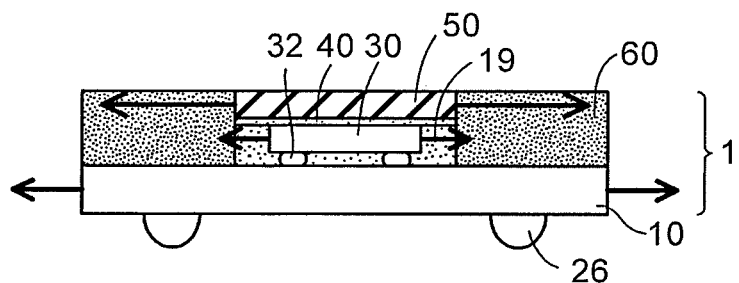
FIGS. 9A to 9C are sectional views depicting schematically states in which the auxiliary member of the semiconductor device according to the embodiment correct the warp.

On the contrary, as depicted in FIG. 9A, the semiconductor device 1 of the embodiment includes the auxiliary member 50 whose coefficient of thermal expansion is larger than those of the semiconductor chip 30 and the wiring substrate 10, on the semiconductor chip 30. Therefore, when the sealing resin 60 is formed by the transfer molding method accompanied with the heating process at 170° C. to 180° C., the auxiliary member 50 of the semiconductor device 1 is expanded more largely than the semiconductor chip 30 and the wiring substrate 10.

Figure 9B:
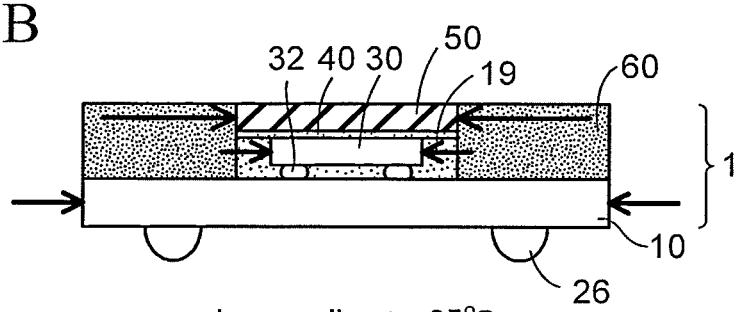

After this, as depicted in FIG. 9B, when the semiconductor device 1 is cooled to 25° C., the auxiliary member 50 is shrunk more largely than the wiring substrate 10. As a result, the warp can be corrected toward the concave direction. In this manner, by the warp correcting function of the auxiliary member 50, the convex warp which is about to occur due to the shrinkage of the wiring substrate 10 can be corrected toward the concave direction which is the opposite direction to the above convex warp.

Figure 9C:
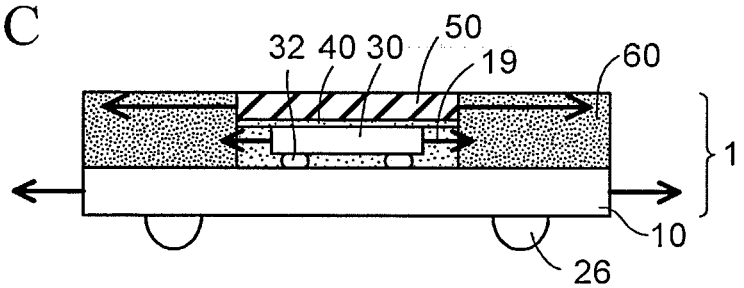

Further, as depicted in FIG. 9C, when the semiconductor device 1 is connected to the motherboard (not shown) by applying the reflow heating to the solder at a temperature of 240° C., the auxiliary member 50 is expanded more largely than the wiring substrate 10. Thus, the warp can be corrected toward the convex direction.

In this way, by the warp correcting function of the auxiliary member 50, the concave warp which is about to occur due to the expansion of the wiring substrate 10 when applying the reflow heating at a temperature of 240° C., can be corrected toward the convex direction which is the opposite direction to the above concave warp.

With the above, the warp can be corrected by the function of the auxiliary member 50, and thus an amount of the warp of the semiconductor device 1 can be suppressed within the allowable value. By this matter, external connection terminals 26 of the semiconductor device 1 can be electrically connected to the motherboard (not shown) with good reliability.

As described above, in the semiconductor device 1 of the embodiment, the auxiliary member 50 is fixed not only on the semiconductor chip 30 but also on the underfill resin 19 which is located in the periphery area of the semiconductor chip 30 and fixes the semiconductor chip 30, and also the side faces of the auxiliary member 50 are fixed by the sealing resin 60.

Further, preferably the auxiliary member 50 is formed of a fiber reinforcement containing resin including glass fiber, or the like. Therefore, the auxiliary member 50 is expanded and shrunk from a normal temperature to a high temperature in a state that the auxiliary member 50 has the rigidity. By this matter, it is possible to make the warp correction act to the whole of the semiconductor device 1.

Next, a method of manufacturing the semiconductor device of the embodiment will be explained hereunder. In the following explanation, the wiring substrate 10, the semiconductor chip 30, and the like in above FIG. 3A are schematically depicted, and detailed elements will be omitted hereinafter.

Figure 10A:
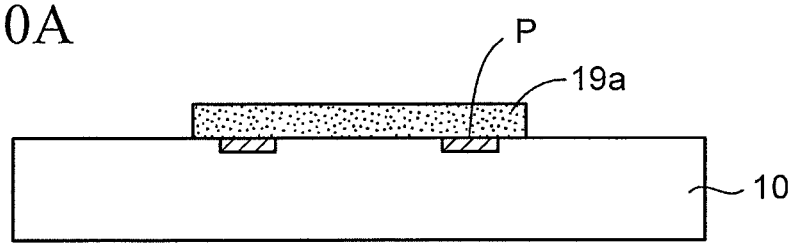
FIGS. 10A to 10C are sectional views (#1) depicting a method of manufacturing a semiconductor device according to the embodiment.

As depicted in FIG. 10A, first, a resin member 19a is formed on the foregoing wiring substrate 10. As the resin member 19a, an epoxy resin, or the like is used. Here, a resin film kept in a semi-cured state (B stage) may be arranged, or a liquid resin may be coated.

Figure 10B:
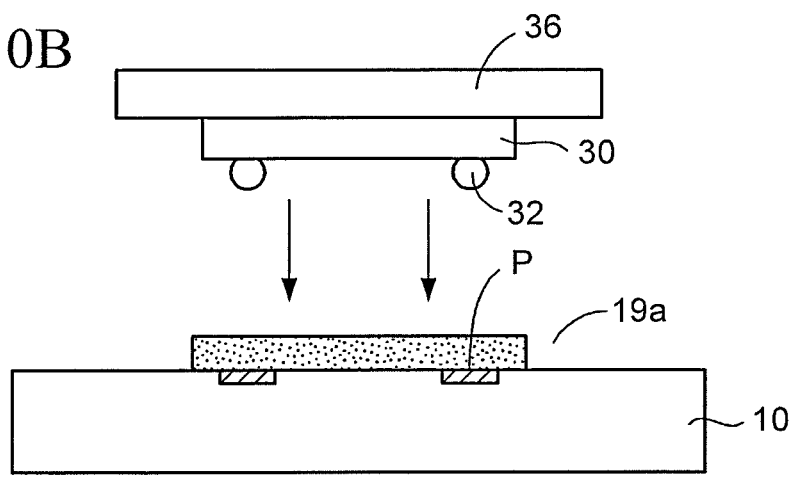

Then, as depicted in FIG. 10B, the semiconductor chip 30 having the connection terminals 32 on the lower surface side is prepared. The connection terminals 32 of the semiconductor chip 30 are aligned so as to correspond to the connection pads P of the wiring substrate 1 described above. Then, the back surface of the semiconductor chip 30 is made to suck to a mounting head 36 including a pressuring/heating mechanism.

Figure 10C:
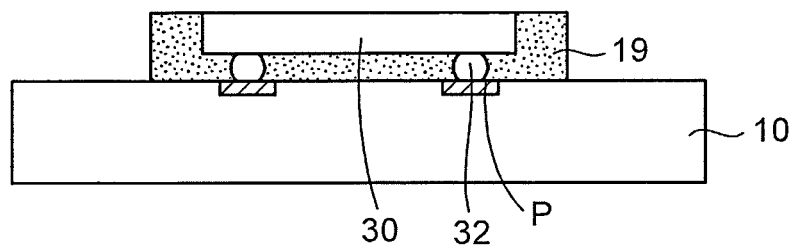

Then, as depicted in FIG. 10C, the semiconductor chip 30 is heated by using the mounting head 36 such that a temperature of the connection terminals 32 is set to about 240° C. Then, the semiconductor chip 30 is pushed into the resin member 19a on the wiring substrate 10.

By this matter, the connection terminals 32 of the semiconductor chip 30 are electrically connected to the connection pads P of the wiring substrate 10. At this time, the resin member 19a which protrudes from the lower area of the semiconductor chip 30 to its periphery area is pressed by the mounting head 36, so that the resin member 19a is arranged in a periphery area of the semiconductor chip 30 at the same height as that of the semiconductor chip 30.

After this, the resin member 19a is cured by applying the reflow heating, and thus the underfill resin 19 is formed from the lower side of the semiconductor chip 30 to its periphery area.

Figure 11A:
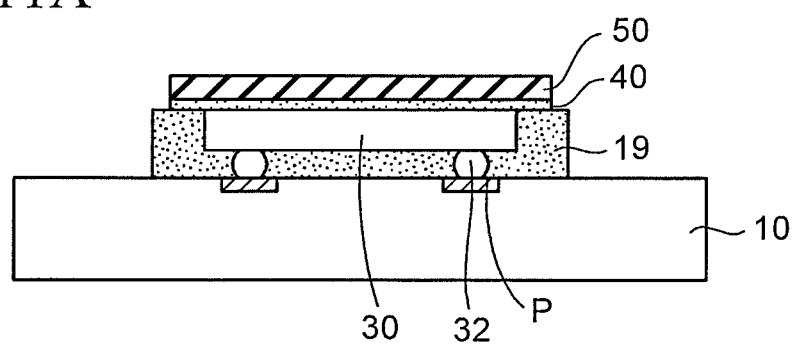
FIGS. 11A and 11B are sectional views (#2) depicting the method of manufacturing the semiconductor device according to the embodiment.

Then, as depicted in FIG. 11A, the auxiliary member 50 is adhered on the back surface of the semiconductor chip 30 and the underfill resin 19 in the periphery area of this semiconductor chip by the adhesive layer 40. At this time, it is preferable that the rigid member containing glass fiber, or the like is used as the auxiliary member 50, and that the adhesive layer 40 is not made to cure completely and is kept still in a semi-cured state such that the auxiliary member 50 can be expanded freely at the later heating process.

In this case, after the adhesive layer 40 is formed on the auxiliary member 50 in advance, the auxiliary member 50 may be fitted to the back surface of the semiconductor chip 30.

Figure 11B:
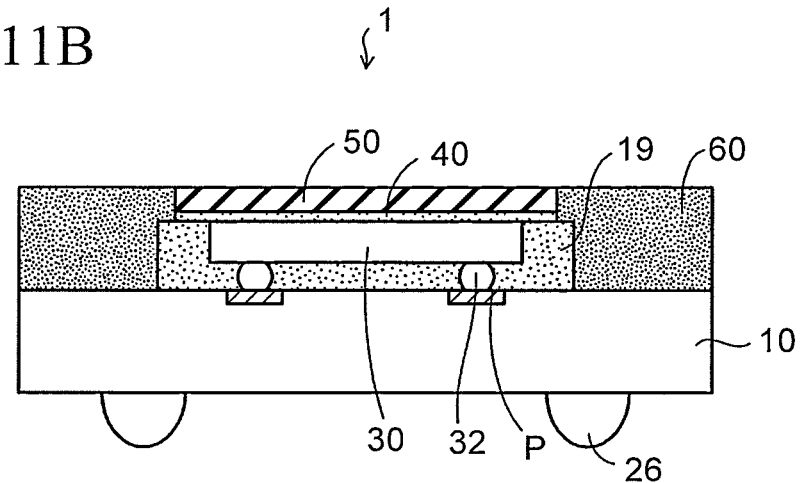

Further, as depicted in FIG. 11B, a resin is poured into the molding die which is heated up to 170° C. to 180° C., by the transfer molding method, and then is cured, thus the sealing resin 60 is obtained.

At this time, as described above, by the warp correcting function of the auxiliary member 50, the convex warp which is about to occur when cooling down to 25° C. in the step of forming the sealing resin 60, can be corrected toward the concave direction in the opposite direction to the above convex warping.

In the step in FIG. 11A, in the case that the auxiliary member 50 having the rigidity is temporarily adhered by the adhesive layer 40 kept in a semi-cured state, the auxiliary member 50 is fixed to the semiconductor chip 30, the underfill resin 19, and the sealing resin 60 in a state that this auxiliary member 50 is expanded by the heating process at an expansion percentage close to an original coefficient of thermal expansion.

By this matter, when cooling down to 25° C. in the step of forming the sealing resin 60, the auxiliary member 50 having the rigidity is shrunk more largely. As a result, the high warp correcting effect can be obtained. In this case, the adhesive layer 40 is cured simultaneously by the heating process when forming the sealing resin 60.

Here, in the step in FIG. 11A, the auxiliary member 50 may be fixed to the semiconductor chip 30 by curing completely the adhesive layer 40. The protruding portion 52 (FIG. 3A) of the auxiliary member 50 is arranged on the underfill resin 19 located in the periphery area of the semiconductor chip 30 via the adhesive layer 40. In this case, in contrast to the case that the adhesive layer 40 is kept in an uncured state, the auxiliary member 50 is hard to expand at the time of the heating process when forming the sealing resin 60 in the step in FIG. 11B. As a result, the warp correction effect is lessened somewhat.

Then, the external connection terminals 26 are provided by mounting the solder ball on the connection pads of the lower surface of the wiring substrate 10 respectively, or the like. By the above manufacturing method, the semiconductor device 1 which is same as that in FIG. 3A described above can be manufactured.

Here, in the case the upper semiconductor device is stacked on the semiconductor device 1, as depicted in above FIG. 5, the opening portions 64 are formed in the sealing resin 60 on the connection pads P, and then the bump electrodes 28 are formed in the opening portions 64.

Also, in the case that a large size wiring substrate for the purpose of multi-production is used, the sealing resin and the wiring substrate are cut such that respective chip mounting areas of the wiring substrate are obtained. As a consequence, individual semiconductor devices can be obtained.

Figure 12:
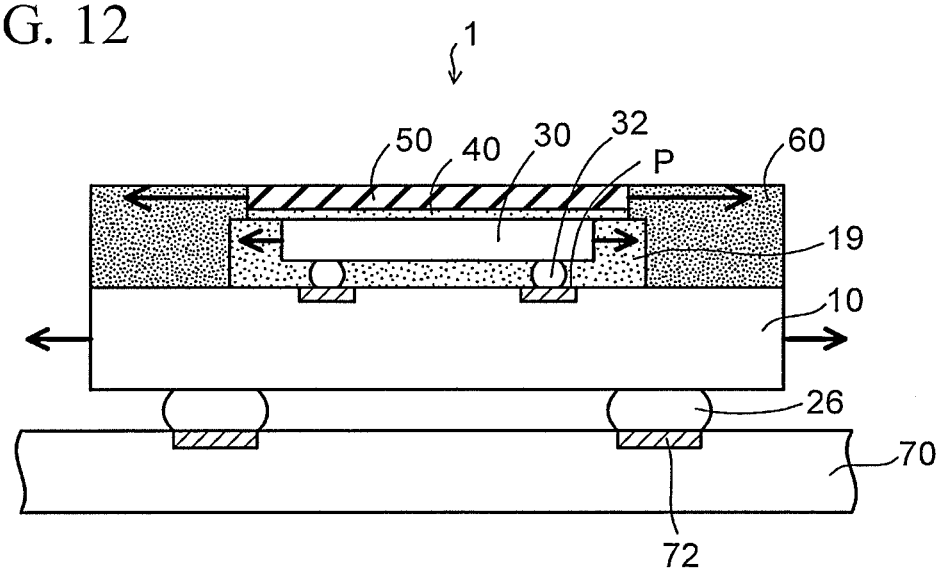
FIG. 12 is a sectional view depicting a state that the semiconductor device according to the embodiment is connected to a mounting substrate.

Then, as depicted in FIG. 12, the external connection terminals 26 of the semiconductor device 1 are arranged on connection electrodes 72 of a mounting substrate 70 such as the motherboard, or the like, and then the reflow heating is applied at a temperature of about 240° C. Thus, both the external electrodes 26 of the semiconductor device 1 and the connection electrodes 72 of a mounting substrate 70 are connected by the solder joining.

At this time, as described above, the concave warp which is about to occur in the semiconductor device 1 can be decreased by the warp correcting function of the auxiliary member 50.

By this matter, the amount of warp of the semiconductor device 1 can be suppressed within the allowable value. As a result, all external connection terminals 26 of the semiconductor device 1 can be electrically connected to the connection electrodes 72 of the mounting substrate 70 with good reliability.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a wiring substrate;
   a semiconductor chip whose connection terminal is connected to the wiring substrate;
   an underfill resin formed from a clearance between the wiring substrate and the semiconductor chip to a periphery area of the semiconductor chip, wherein the underfill resin in the periphery area is formed at a same height as an upper surface of the semiconductor chip;
   an auxiliary member fixed on the semiconductor chip by an adhesive layer, and including a protruding portion which protrudes to an outside from the semiconductor chip, and the protruding portion arranged at least on the underfill resin via the adhesive layer; and
   a sealing resin sealing the underfill resin and at least side faces of the auxiliary member;
   wherein respective coefficients of thermal expansion of the auxiliary member and the adhesive layer are larger than a coefficient of thermal expansion of the semiconductor chip.

2. A semiconductor device according to claim 1, wherein the coefficient of thermal expansion of the auxiliary member is larger than a coefficient of thermal expansion of the wiring substrate.

3. A semiconductor device according to claim 1, wherein an opening portion reaching a connection pad of the wiring substrate is formed in the sealing resin, and the connection pad arranged on a face side of the wiring substrate, on which the semiconductor chip is mounted.

4. A semiconductor device according to claim 1, wherein the auxiliary member is formed of a resin or a fiber reinforcement containing resin.

5. A method of manufacturing a semiconductor device, comprising:
   forming resin material on a wiring substrate;
   pushing a connection terminal of a semiconductor chip into the resin material, and connecting the connection terminal to a connection pad of the wiring substrate, and forming an underfill resin from the resin material from a clearance between the wiring substrate and the semiconductor chip to a periphery area of the semiconductor chip, wherein the underfill resin in the periphery area is formed at a same height as an upper surface of the semiconductor chip;
   forming an auxiliary member including a protruding portion which protrudes to an outside from the semiconductor chip, on the semiconductor chip via an adhesive layer, wherein the protruding portion is arranged on the underfill resin via the adhesive layer; and
   forming a sealing resin sealing the underfill resin and at least side faces of the auxiliary member;
   wherein respective coefficients of thermal expansion of the auxiliary member and the adhesive layer are larger than a coefficient of thermal expansion of the semiconductor chip.

6. A method of manufacturing a semiconductor device, according to claim 5, wherein the adhesive layer is cured simultaneously in the forming the sealing resin.

7. A method of manufacturing a semiconductor device, according to claim 5, wherein, after the forming the sealing resin, the semiconductor device is connected to a mounting substrate via an external connection terminal which is provided under the wiring substrate, with a heating process.

* * * * *